US012587138B2

(12) United States Patent
Khlat

(10) Patent No.: US 12,587,138 B2
(45) Date of Patent: Mar. 24, 2026

(54) ASYMMETRICAL POWER AMPLIFIER CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 364 days.

(21) Appl. No.: 18/295,990

(22) Filed: Apr. 5, 2023

(65) Prior Publication Data

US 2023/0370021 A1     Nov. 16, 2023

Related U.S. Application Data

(60) Provisional application No. 63/341,127, filed on May 12, 2022.

(51) Int. Cl.
*H03F 1/02*          (2006.01)
*H03F 3/24*          (2006.01)

(52) U.S. Cl.
CPC ............... *H03F 1/02* (2013.01); *H03F 3/245* (2013.01); *H03F 2200/451* (2013.01)

(58) Field of Classification Search
CPC ....... H03F 1/02; H03F 3/245; H03F 2200/451
See application file for complete search history.

(56) References Cited

U.S. PATENT DOCUMENTS

2002/0146993 A1     10/2002  Persico et al.
2004/0119533 A1*     6/2004  Kwon ........................ H03F 3/24
                                                              330/124 R 2010/0148862 A1*     6/2010  Woo ....................... H03F 1/0288
                                                              330/124 R
(Continued)

FOREIGN PATENT DOCUMENTS

JP          2014175760 A  *  9/2014
KR          2015000966 A  *  1/2015
KR         20150000966 A      1/2015

OTHER PUBLICATIONS

Author Unknown, "Doherty amplifier with cooperative power tracking and bias adaption for high efficiency," Research Disclosure, May 2012, 27 pages.
Lee, Y.-S. et al., "Highly Linear and Efficient Doherty Amplifier Employing Power Tracking Bias Supply Scheme for WCDMA Applications," 2008 IEEE Radio and Wireless Symposium, Jan. 22-24, 2008, Orlando, FL, USA, IEEE, pp. 73-76.
(Continued)

*Primary Examiner* — Junpeng Chen
(74) *Attorney, Agent, or Firm* — Withrow & Terranova, P.L.L.C.

(57)          ABSTRACT

An asymmetrical power amplifier circuit is provided. The asymmetrical power amplifier circuit includes a carrier amplifier and a peak amplifier. The carrier amplifier is always active to amplify a radio frequency (RF) to a carrier output power, while the peak amplifier is only active to amplify the RF signal to a peak output power when a time-variant output power of the RF signal is higher than a predefined power threshold. The RF signal in the carrier output power is summed with the RF signal in the peak output power to thereby output the amplified RF signal in the time-variant output power. Unlike a conventional symmetrical power amplifier, the carrier output power and the peak output power are different at a peak of the time-variant output power. As such, the carrier amplifier and the peak amplifier can both operate with optimal efficiency based on a same modulated voltage.

20 Claims, 11 Drawing Sheets

(56) References Cited

U.S. PATENT DOCUMENTS

| | | | | |
|---|---|---|---|---|
| 2015/0116039 | A1* | 4/2015 | Ahmed | H03F 1/0233 |
| | | | | 330/295 |
| 2015/0180428 | A1* | 6/2015 | Pham | H03F 3/211 |
| | | | | 330/295 |
| 2015/0263678 | A1* | 9/2015 | Kunihiro | H03F 1/0288 |
| | | | | 330/295 |
| 2015/0295541 | A1 | 10/2015 | Hur et al. | |
| 2015/0318827 | A1 | 11/2015 | Srinidhi Embar et al. | |
| 2017/0163220 | A1* | 6/2017 | Yamamoto | H03F 1/56 |
| 2017/0257068 | A1 | 9/2017 | Hur et al. | |
| 2018/0241362 | A1* | 8/2018 | Takenaka | H03F 1/0288 |
| 2020/0350866 | A1 | 11/2020 | Pehlke | |
| 2021/0167735 | A1* | 6/2021 | Baroudi | H03F 3/19 |
| 2021/0384867 | A1 | 12/2021 | Imai | |
| 2021/0399688 | A1 | 12/2021 | Koroglu et al. | |
| 2022/0231638 | A1* | 7/2022 | Hatanaka | H03F 1/0288 |
| 2022/0239259 | A1* | 7/2022 | Sakata | H03F 1/0288 |
| 2023/0046261 | A1* | 2/2023 | Yu | H03F 1/565 |

OTHER PUBLICATIONS

Ryu, N. et al., "CMOS Doherty Amplifier With Variable Balun Transformer and Adaptive Bias Control for Wireless LAN Application," IEEE Journal of Solid-State Circuits, vol. 49, No. 6, Jun. 2014, IEEE, pp. 1356-1365.

Extended European Search Report for European Patent Application No. 23154372.9, mailed Jun. 6, 2023, 14 pages.

Darraji, R. et al., "Mitigation of Bandwidth Limitation in Wireless Doherty Amplifiers With Substantial Bandwidth Enhancement Using Digital Techniques," IEEE Transactions on Microwave Theory and Techniques, vol. 60, No. 9, Sep. 2012, IEEE, pp. 2875-2885.

Kim, J.-H. et al., "Analysis and Implementation of Doherty Power Amplifier With Two-Point Envelope Modulation," IEEE Transactions on Microwave Theory and Techniques, vol. 60, No. 5, May 2012, IEEE, pp. 1353-1364.

Extended European Search Report for European Patent Application No. 23171932.9, mailed Oct. 10, 2023, 14 pages.

* cited by examiner

ASYMMETRICAL POWER AMPLIFIER CIRCUIT

RELATED APPLICATIONS

This application claims the benefit of U.S. provisional patent application Ser. No. 63/341,127, filed on May 12, 2022, the disclosure of which is hereby incorporated herein by reference in its entirety.

FIELD OF THE DISCLOSURE

The technology of the disclosure relates generally to a power amplifier circuit.

BACKGROUND

The fifth generation (5G) system has been widely regarded as the next generation wireless communication system beyond the current third generation (3G) and fourth generation (4G) systems. In this regard, a 5G-capable wireless communication device is expected to achieve higher data rates, improved coverage range, enhanced signaling efficiency, and reduced latency.

The 5G-capable wireless communication device typically includes multiple transmitters to simultaneously transmit multiple 5G radio frequency (RF) signals under such schemes as Carrier Aggregation (CA) and Evolved-Universal Terrestrial Radio Access (E-UTRA) New Radio (NR) Dual Connectivity (DC) (ENDC). Since the transmitters typically transmit the 5G RF signals in a millimeter wave spectrum, the RF signals can be more susceptible to propagation attenuation and interference. To help mitigate propagation attenuation and maintain desirable data throughput, the 5G-capable wireless communication device typically employs multiple power amplifiers to amplify the RF signals to desired power levels before transmitting the RF signals from the transmitters. As such, it is desirable to ensure that the power amplifiers can operate with optimal efficiency, especially when the RF signals are transmitted with different peak-to-average ratios (PARs).

SUMMARY

Embodiments of the disclosure relate to an asymmetrical power amplifier circuit. The asymmetrical power amplifier circuit includes a carrier amplifier and a peak amplifier. The carrier amplifier is always active to amplify a radio frequency (RF) to a carrier output power, while the peak amplifier is only active to amplify the RF signal to a peak output power when a time-variant output power of the RF signal is higher than a predefined power threshold. The RF signal in the carrier output power is summed with the RF signal in the peak output power to thereby output the amplified RF signal in the time-variant output power. Unlike a conventional symmetrical power amplifier, wherein the carrier output power is equal to the peak output power at a peak of the time-variant output power, the carrier output power and the peak output power in the asymmetrical power amplifier are different at the peak of the time-variant output power. As a result, the carrier amplifier and the peak amplifier in the asymmetrical power amplifier can both operate with optimal efficiency based on a same modulated voltage.

In one aspect, an asymmetrical power amplifier is provided. The asymmetrical power amplifier includes a signal input to receive an RF signal in a time-variant input power.

The asymmetrical power amplifier also includes a signal output to output the RF signal in a time-variant output power that equals a sum of a carrier output power and a peak output power. The asymmetrical power amplifier also includes a carrier amplifier. The carrier amplifier is configured to amplify the RF signal from the time-variant input power to the carrier output power based on a modulated voltage. The asymmetrical power amplifier also includes a peak amplifier. The peak amplifier is configured to amplify the RF signal from the time-variant input power to the peak output power based on the modulated voltage. The asymmetrical power amplifier also includes an impedance control circuit. The impedance control circuit is coupled to the carrier amplifier and the peak amplifier. The impedance control circuit is configured to cause the carrier output power to be different from the peak output power at the peak of the time-variant output power of the RF signal.

In another aspect, a wireless communication circuit is provided. The wireless communication circuit includes a transceiver circuit. The transceiver circuit is configured to generate an RF signal in a time-variant input power. The wireless transmission circuit also includes an asymmetrical power amplifier circuit. The asymmetrical power amplifier circuit includes a signal input to receive the RF signal in the time-variant input power. The asymmetrical power amplifier circuit also includes a signal output to output the RF signal in a time-variant output power that equals a sum of a carrier output power and a peak output power. The asymmetrical power amplifier circuit also includes a carrier amplifier. The carrier amplifier is configured to amplify the RF signal from the time-variant input power to the carrier output power based on a modulated voltage. The asymmetrical power amplifier circuit also includes a peak amplifier. The peak amplifier is configured to amplify the RF signal from the time-variant input power to the peak output power based on the modulated voltage. The asymmetrical power amplifier circuit also includes an impedance control circuit. The impedance control circuit is coupled to the carrier amplifier and the peak amplifier. The impedance control circuit is configured to cause the carrier output power to be different from the peak output power at the peak of the time-variant output power of the RF signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
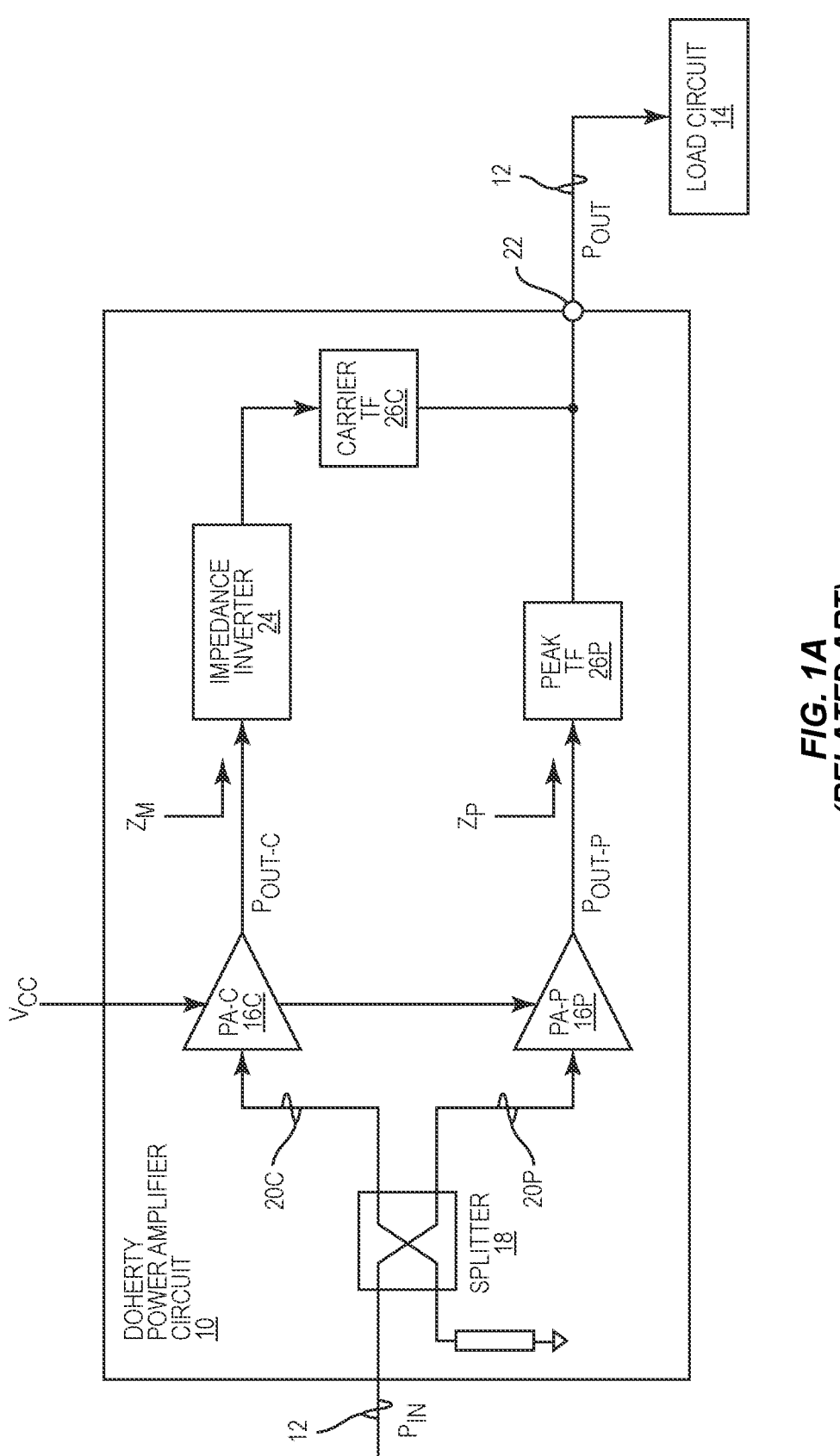
FIG. 1A is a schematic diagram of an exemplary Doherty power amplifier circuit, which is commonly known as a symmetrical power amplifier circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an asymmetrical power amplifier circuit. The asymmetrical power amplifier circuit includes a carrier amplifier and a peak amplifier. The carrier amplifier is always active to amplify a radio frequency (RF) to a carrier output power, while the peak amplifier is only active to amplify the RF signal to a peak output power when a time-variant output power of the RF signal is higher than a predefined power threshold. The RF signal in the carrier output power is summed with the RF signal in the peak output power to thereby output the amplified RF signal in the time-variant output power. Unlike a conventional symmetrical power amplifier, wherein the carrier output power is equal to the peak output power at a peak of the time-variant output power, the carrier output power and the peak output power in the asymmetrical power amplifier are different at the peak of the time-variant output power. As a result, the carrier amplifier and the peak amplifier in the asymmetrical power amplifier can both operate with optimal efficiency based on a same modulated voltage.

Figure 1B:
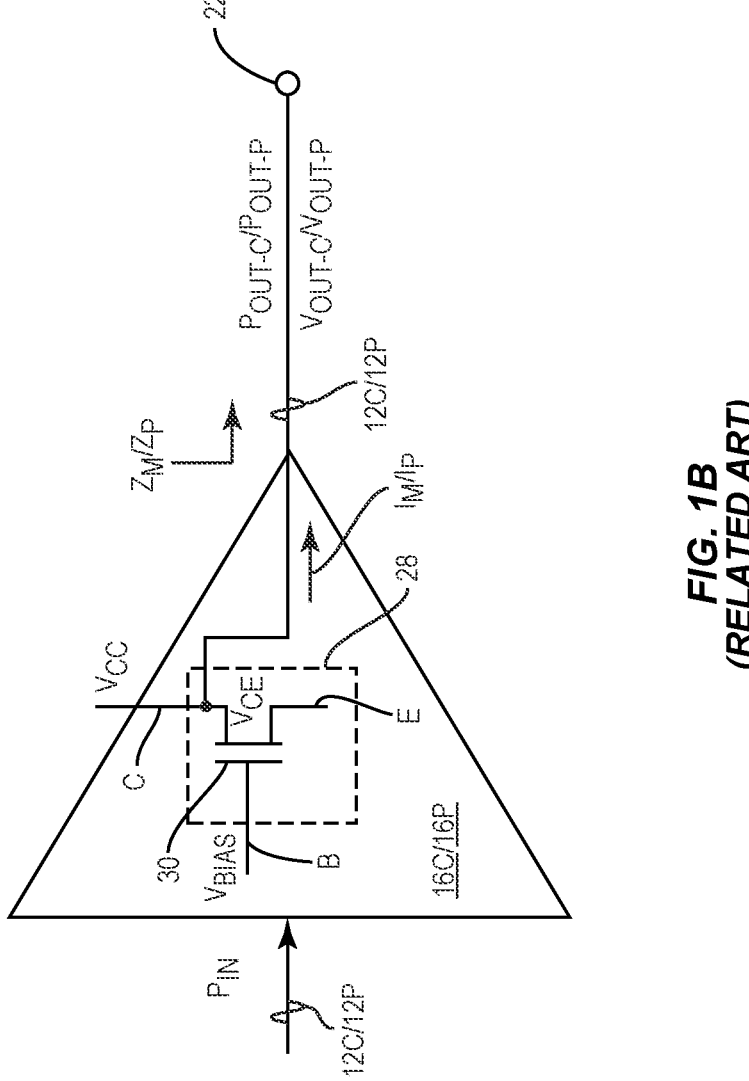
FIG. 1B is a schematic diagram providing an exemplary illustration of an output stage of a carrier amplifier and a peak amplifier in the Doherty power amplifier circuit of FIG. 1A.
Figure 1D:
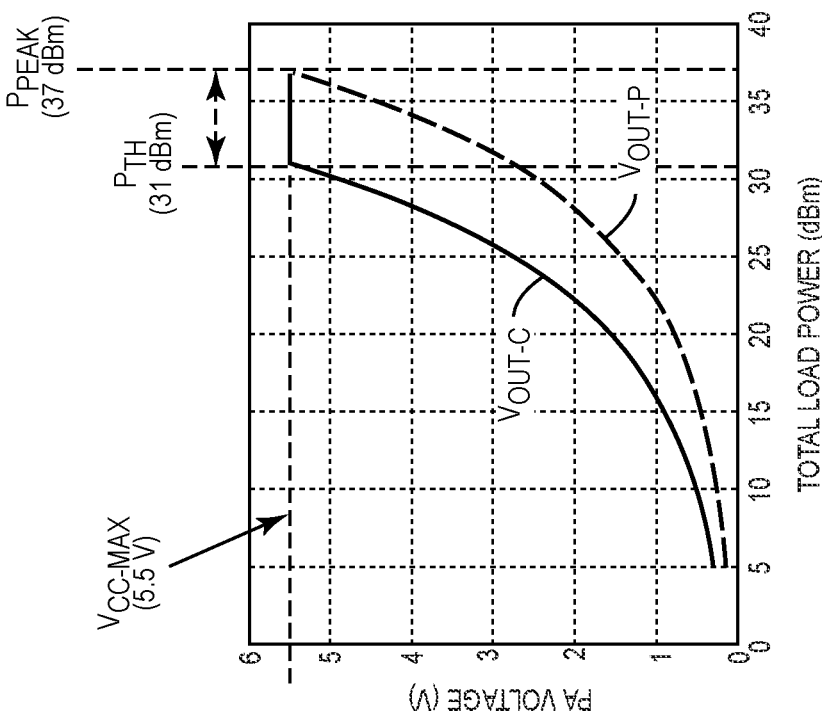
FIGS. 1C-1E are graphic diagrams providing exemplary illustrations of characteristics of the Doherty power amplifier circuit of FIG. 1A.
Figure 1C:
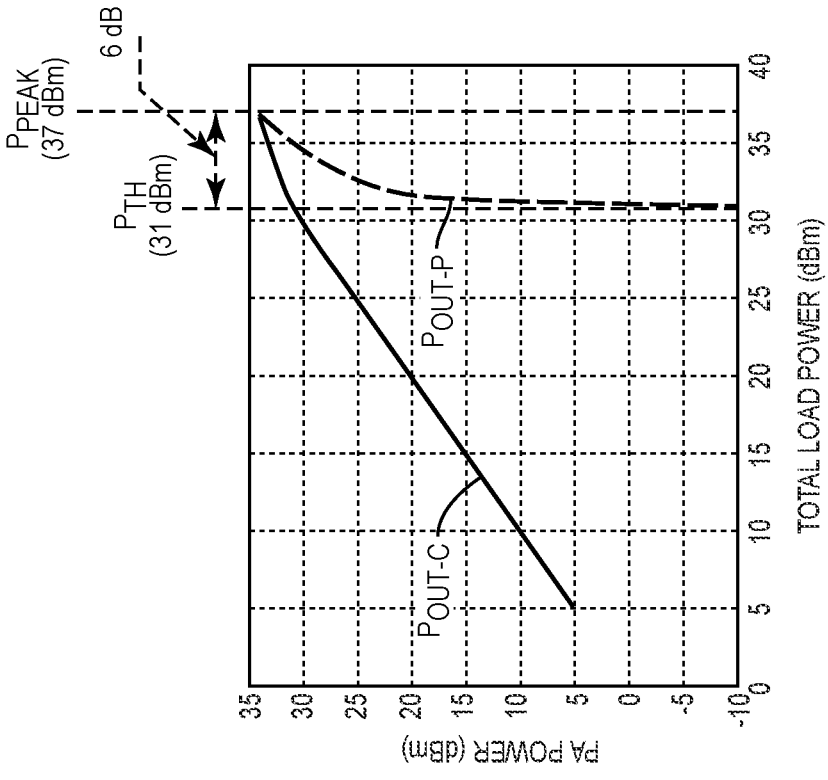
Figure 1E:
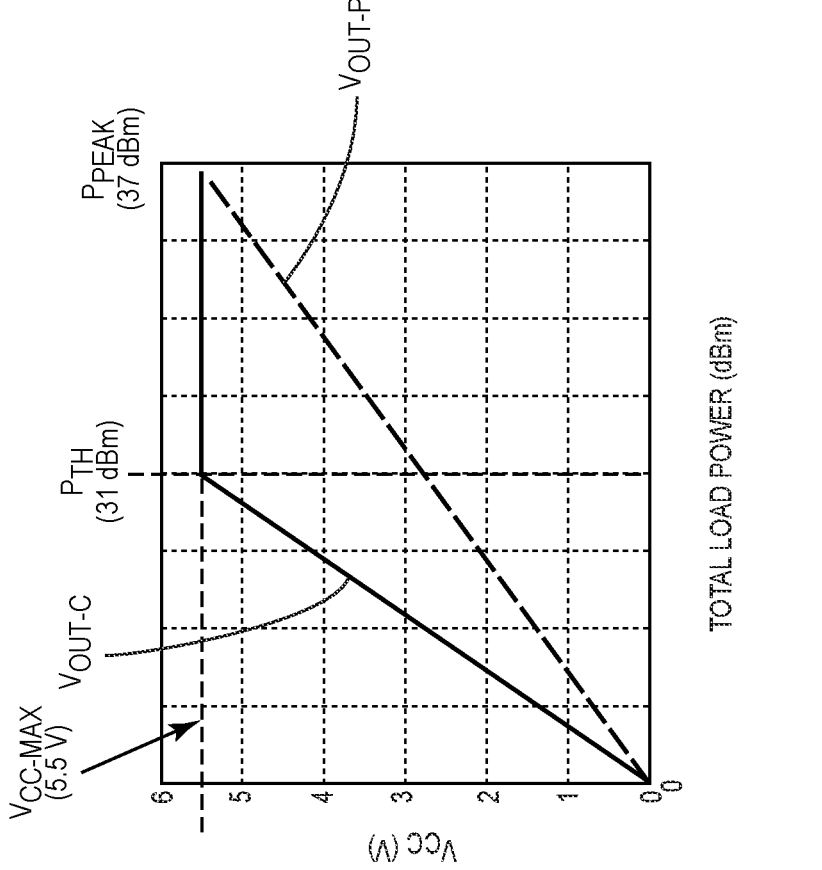
Figure 2:
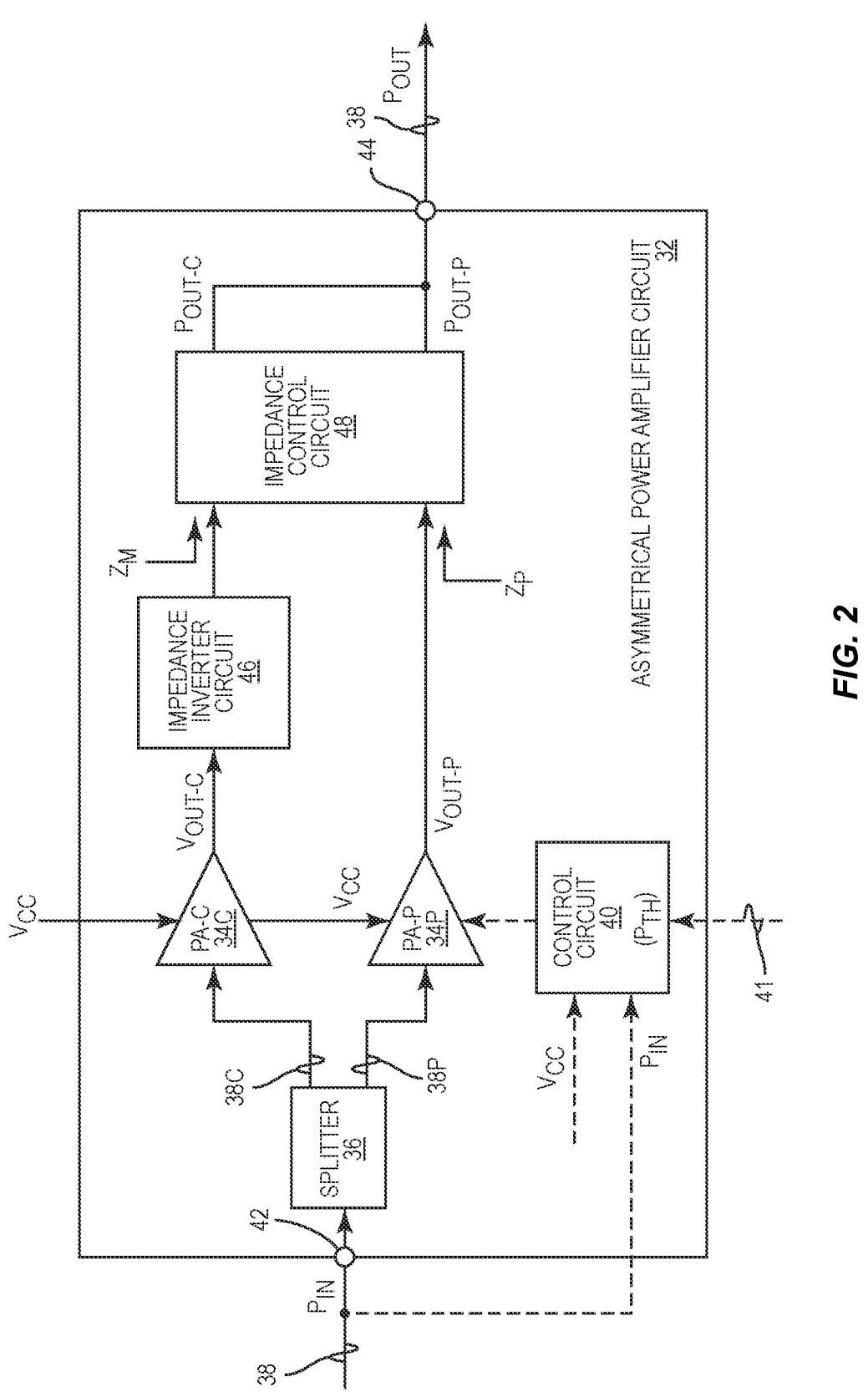
FIG. 2 is a schematic diagram of an exemplary asymmetrical power amplifier circuit configured according to an embodiment of the present disclosure to achieve improved overall efficiency over the Doherty power amplifier circuit of FIG. 1A.

Before discussing the asymmetrical power amplifier circuit according to the present disclosure, starting at FIG. 2, an overview of a standard Doherty power amplifier circuit is first provided with reference to FIGS. 1A-1F to help understand the configuration and operation of a conventional symmetrical power amplifier circuit.

FIG. 1A is a schematic diagram of an exemplary Doherty power amplifier circuit 10, which is commonly known as a symmetrical power amplifier circuit. The Doherty power amplifier circuit 10 is configured to amplify an RF signal 12 from a time-variant input power $P_{IN}$ to a time-variant output power $P_{OUT}$ based on a modulated voltage $V_{CC}$. The Doherty power amplifier circuit 10 is coupled to a load circuit 14 (e.g., a transmitter circuit, an antenna circuit, etc.) that can transmit the amplified RF signal 12.

The Doherty power amplifier circuit 10 includes a carrier amplifier 16C (denoted as "PA-C") and a peak amplifier 16P (denoted as "PA-P"). The Doherty power amplifier circuit 10 also includes a splitter 18 that splits the RF signal 12 into a carrier signal 20C and a peak signal 20P, each having one-half of the time-variant input power $P_{IN}$ ($\frac{1}{2}P_{IN}$). The carrier amplifier 16C is configured to amplify the carrier signal 20C to a carrier output power $P_{OUT-C}$ based on the modulated voltage $V_{CC}$. Likewise, the peak amplifier 16P is configured to amplify the peak signal 20P to a peak output power $P_{OUT-P}$ also based on the modulated voltage $V_{CC}$. The modulated voltage $V_{CC}$ is typically an average power tracking (APT) voltage that keeps track of an average power (e.g., root-mean-square power) of the time-variant output power $P_{OUT}$.

The carrier amplifier 16C is coupled to a signal output 22 via an impedance inverter 24 and a carrier transfer function (TF) 26C. The impedance inverter 24 and the carrier TF 26C can be configured to collectively modulate a carrier imped-ance $Z_M$ seen by the carrier amplifier 16C. The peak ampli-fier 16P is coupled to the signal output 22 via a peak TF 26P. The peak TF 26P can be configured to modulate a peak impedance $Z_P$ seen by the peak amplifier 16P.

In the Doherty power amplifier circuit 10, the carrier amplifier 16C is always active to amplify the carrier signal 20C to the carrier output power $P_{OUT-C}$. In contrast, the peak amplifier 16P is only active when the time-variant output power $P_{OUT}$ is higher than or equal to a predefined power threshold $P_{TH}$. In this regard, when the peak amplifier 16P is inactive, the time-variant output power $P_{OUT}$ of the RF signal 12 will be equal to the carrier output power $P_{OUT-C}$ ($P_{OUT}=P_{OUT-C}$). In contrast, when the peak amplifier 16P is active, the time-variant output power $P_{OUT}$ of the RF signal 12 will be equal to a sum of the carrier output power $P_{OUT-C}$ and the peak output power $P_{OUT-P}$ ($P_{OUT}=P_{OUT-C}+P_{OUT-P}$).

FIG. 1B is a schematic diagram providing an exemplary illustration of an output stage 28 of the carrier amplifier 16C and the peak amplifier 16P in the Doherty power amplifier circuit 10 of FIG. 1A. Common elements between FIGS. 1A and 1B are shown therein with common element numbers and will not be re-described herein.

The output stage 28 can include at least one transistor 30, such as a bipolar junction transistor (BJT) or a complemen-tary metal-oxide semiconductor (CMOS) transistor. Taking the BJT as an example, the transistor 30 can include a base electrode B, a collector electrode C, and an emitter electrode E. The base electrode B is configured to receive a bias voltage $V_{BIAS}$ and the collector electrode C is configured to receive the modulated voltage $V_{CC}$. The collector electrode C is also coupled to the signal output 22 that outputs the amplified RF signal 12 at the time-variant output power $P_{OUT}$.

When acting as the carrier amplifier 16C in the Doherty power amplifier circuit 10, the carrier output power $P_{OUT-C}$ of the amplified carrier signal 12C will be a function of a modulated carrier voltage $V_{OUT-C}$ at the collector electrode C and the carrier impedance $Z_M$, as expressed in equation (Eq. 1) below.

$$P_{OUT-C}=I_M*V_{OUT-C}\approx V_{OUT-C}^2/Z_M \qquad (Eq. 1)$$

In the equation (Eq. 1), $I_M$ represents a modulated carrier current generated by the carrier amplifier 16C and $Z_M$ represents a modulated carrier impedance seen by the carrier amplifier 16C. In contrast, when acting as the peak amplifier 16P in the Doherty power amplifier circuit 10, the peak output power $P_{OUT-P}$ of the amplified peak signal 12P will be a function of a modulated peak voltage $V_{OUT-P}$ at the collector electrode C and the peak impedance $Z_P$, as expressed in equation (Eq. 2) below.

$$P_{OUT-P}=I_P*V_{OUT-P}\approx V_{OUT-P}^2/Z_P \qquad (Eq. 2)$$

In the equation (Eq. 2), $I_P$ represents a modulated peak current generated by the peak amplifier 16P and $Z_P$ repre-sents a modulated peak impedance seen by the peak ampli-fier 16P. The modulated carrier voltage $V_{OUT-C}$ and the modulated peak voltage $V_{OUT-P}$ are both proportionally related to the modulated voltage $V_{CC}$, as expressed in equation (Eq. 3) below.

$$V_{OUT-C}=V_{CC}-V_{CE}$$

$$V_{OUT-P}=V_{CC}-V_{CE} \qquad (Eq. 3)$$

In the equation (Eq. 3), $V_{CE}$ represents a collector-emitter voltage, which will be substantially equal to zero when the carrier amplifier 16C and the peak amplifier 16P operate in compression. As a result, the modulated carrier voltage $V_{OUT-C}$ and the modulated peak voltage $V_{OUT-P}$ will be substantially equal to the modulated voltage $V_{CC}$ ($V_{OUT-C}\approx V_{CC}$, $V_{OUT-P}\approx V_{CC}$). Accordingly, the carrier amplifier 16C and the peak amplifier 16P will be able to operate with optimal efficiency.

The Doherty power amplifier circuit 10 is commonly referred to as a symmetrical power amplifier circuit because of several distinguishable characteristics, as illustrated in FIGS. 1C-1E. In this regard, FIGS. 1C-1E are graphic diagrams providing exemplary illustrations of the distin-guishable characteristics of the Doherty power amplifier circuit 10 of FIG. 1A. In examples described in FIGS. 1C-1E, it is assumed that a peak of the time-variant output power $P_{OUT}$ (hereinafter referred to as "$P_{PEAK}$" for brevity) is 37 dBm and a maximum of the modulated voltage $V_{CC}$ (hereinafter referred to as "$V_{CC-MAX}$" for brevity) is 5.5 V.

FIG. 1C shows a relationship between the carrier output power $P_{OUT-C}$ and the peak output power $P_{OUT-P}$ in the Doherty power amplifier circuit 10 of FIG. 1A. In a con-ventional symmetrical power amplifier circuit like the Doherty power amplifier circuit 10, the predefined power threshold $P_{TH}$ is typically 6 dB below the $P_{PEAK}$. In examples discussed herein, the $P_{PEAK}$ is assumed to be 37 dBm. Accordingly, the predefined power threshold $P_{TH}$ will be 31 dBm.

When the time-variant output power $P_{OUT}$ is lower than the predefined power threshold $P_{TH}$, only the carrier ampli-fier 16C is active to amplify the carrier signal 20C to the carrier output power $P_{OUT-C}$. When the time-variant output power $P_{OUT}$ is higher than or equal to the predefined power threshold $P_{TH}$, the peak amplifier 16P becomes active to amplify the peak signal 20P to the peak output power $P_{OUT-P}$, while the carrier amplifier 16C continues to amplify the carrier signal 20C. As shown in FIG. 1C, the carrier output power $P_{OUT-C}$ and the peak output power $P_{OUT-P}$ each equals 34 dBm, which is one-half of the $P_{PEAK}$. In other words, the carrier output power $P_{OUT-C}$ is equal to the peak output power $P_{OUT-P}$ at the $P_{PEAK}$.

In the conventional symmetrical power amplifier circuit like the Doherty power amplifier circuit 10, the carrier impedance $Z_M$ seen by the carrier amplifier 16C is typically equal to the peak impedance $Z_P$ seen by the peak amplifier 16P. As such, the peak amplifier 16P would need to increase the modulated peak current $I_P$ at a faster rate than that of the modulated carrier current $I_M$ such that the peak output power $P_{OUT-P}$ can become equal to the carrier output power $P_{OUT-C}$ at the $P_{PEAK}$. The Doherty power amplifier circuit 10 is said to perform an ideal load modulation when a change rate of the modulated peak current $\Delta I_P$ is twice a change rate of modulated carrier current $\Delta I_M$ ($\Delta I_P=2\Delta I_M$).

FIG. 1D shows a relationship between the modulated carrier voltage $V_{OUT-C}$ and the modulated peak voltage $V_{OUT-P}$ in the Doherty power amplifier circuit 10 of FIG. 1A. When the time-variant output power $P_{OUT}$ is lower than the predefined power threshold $P_{TH}$, only the carrier amplifier 16C is active. In this regard, the modulated carrier voltage $V_{OUT-C}$ will increase as the time-variant output power $P_{OUT}$ increases. When the time-variant output power $P_{OUT}$ is higher than or equal to the predefined power threshold $P_{TH}$, the peak amplifier 16P becomes active. Accordingly, the modulated peak voltage $V_{OUT-P}$ will increase as the time-variant output power $P_{OUT}$ continues to increase. In the meantime, the carrier amplifier 16C will maintain the modulated carrier voltage $V_{OUT-C}$ constantly at the $V_{CC-MAX}$. As shown in FIG. 1D, the modulated carrier voltage $V_{OUT-C}$ and the modulated peak voltage $V_{OUT-P}$ are both equal to the $V_{CC-MAX}$ at the $P_{PEAK}$.

FIG. 1E shows the modulated voltage $V_{CC}$ received by the carrier amplifier 16C and the peak amplifier 16D at the respective collector electrode C. When the time-variant output power $P_{OUT}$ is lower than the predefined power threshold $P_{TH}$, only the carrier amplifier 16C is active. In this regard, the modulated voltage $V_{CC}$ can be so generated in accordance with the equation (Eq. 3) to be substantially close to the modulated carrier voltage $V_{OUT-C}$. As a result, the carrier amplifier 16C can operate in compression to achieve optimal efficiency.

When the time-variant output power $P_{OUT}$ reaches the predefined power threshold $P_{TH}$, the modulated voltage $V_{CC}$ reaches, and is maintained at, the $V_{CC-MAX}$. Thereafter, the peak amplifier 16P becomes active to amplify the peak signal 20P based on the $V_{CC-MAX}$. Given that the $V_{CC-MAX}$ is always higher than the modulated peak voltage $V_{OUT-P}$, the peak amplifier 16P will not operate in compression until the time-variant output power $P_{OUT}$ reaches the $P_{PEAK}$ of 37 dBm. In other words, the peak amplifier 16P will not operate with optimal efficiency prior to the $P_{PEAK}$.

Although it may be possible to improve the efficiency of the peak amplifier 16P by providing another modulated voltage to keep track of the modulated peak voltage $V_{OUT-P}$, doing so may require an additional power management chip that can lead to an increase in footprint and cost. Hence, it is desirable to improve the efficiency of the carrier amplifier 16C and the peak amplifier 16P based on the same modulated voltage $V_{CC}$.

FIG. 2 is a schematic diagram of an exemplary asymmetrical power amplifier circuit 32 configured according to an embodiment of the present disclosure to achieve improved overall efficiency over the Doherty power amplifier circuit 10 of FIG. 1A. Like the Doherty power amplifier circuit 10, the asymmetrical power amplifier circuit 32 includes a carrier amplifier 34C (denoted as "PA-C"), a peak amplifier 34P (denoted as "PA-P"), and a splitter 36.

The splitter 36 is configured to split an RF signal 38 into a carrier signal 38C and a peak signal 38P, each having one-half of a time-variant input power $P_{IN}$ of the RF signal 38. The carrier amplifier 34C is always active to amplify the carrier signal 38C to a carrier output power $P_{OUT-C}$ based on a modulated voltage $V_{CC}$. The peak amplifier 34P is only active when a time-variant output power $P_{OUT}$ of the RF signal 38 is higher than or equal to a predefined power threshold $P_{TH}$. When active, the peak amplifier 34P amplifies the peak signal 38P to a peak output power $P_{OUT-P}$ based on the modulated voltage $V_{CC}$.

Each of the carrier amplifier 34C and the peak amplifier 34P can be configured in a similar fashion as illustrated in FIG. 1B. As such, in accordance with the equation (Eq. 3), the carrier amplifier 34C and the peak amplifier 34P will each operate with optimal efficiency when the modulated voltage $V_{CC}$ is substantially equal to a modulated carrier voltage $V_{OUT-C}$ and a modulated peak voltage $V_{OUT-P}$, respectively.

The asymmetrical power amplifier circuit 32 differs from the Doherty power amplifier circuit 10 in several aspects. In one aspect, the carrier output power $P_{OUT-C}$ will not be equal to the peak output power $P_{OUT-P}$ at the $P_{PEAK}$. In a non-limiting example, the carrier output power $P_{OUT-C}$ is higher than the peak output power $P_{OUT-P}$ at the $P_{PEAK}$.

In another aspect, the predefined power threshold $P_{TH}$ in the asymmetrical power amplifier circuit 32 is higher than the predefined power threshold $P_{TH}$ in the Doherty power amplifier circuit 10. Recall that in the Doherty power amplifier circuit 10 of FIG. 1A, the predefined power threshold $P_{TH}$ is set at 31 dBm, which is 6 dB below the $P_{PEAK}$ (37 dBm). In a non-limiting example, the predefined power threshold $P_{TH}$ in the asymmetrical power amplifier circuit 32 can be set at 33 dBm. As a result, the peak amplifier 34P will be activated later than the peak amplifier 16P in the Doherty power amplifier circuit 10.

In an embodiment, the asymmetrical power amplifier circuit 32 may include a control circuit 40, which can be a field-programmable gate array (FPGA) or an application-specific integrated circuit (ASIC), as an example. The control circuit 40 may be configured to store the predefined power threshold $P_{TH}$. Accordingly, the control circuit 40 can activate or deactivate the peak amplifier 34P based on the time-variant output power $P_{OUT}$ and the stored predefined power threshold $P_{TH}$. In one embodiment, the control circuit 40 may derive the time-variant output power $P_{OUT}$ from the modulated voltage $V_{CC}$ and/or the time-variant input power $P_{IN}$ of the RF signal 38 (e.g., via an envelope detector). In another embodiment, the control circuit 40 may determine the time-variant output power $P_{OUT}$ from an externally generated indication signal 41. In a non-limiting example, the externally generated indication signal 41 can be provided by a transceiver circuit (not shown) that generates the RF signal 38.

By configuring the asymmetrical power amplifier circuit 32 to produce the carrier output power $P_{OUT-C}$ and the peak output power $P_{OUT-P}$ at different levels and increasing the predefined power threshold $P_{TH}$, it is possible to generate the modulated voltage $V_{CC}$ from a single power management circuit to closely track the modulated carrier voltage $V_{OUT-C}$, and reduce a gap between the modulated voltage $V_{CC}$ and the modulated peak voltage $V_{OUT-P}$. As a result, the carrier amplifier 34C and the peak amplifier 34P may both operate with improved efficiency, thus helping to improve overall efficiency of the asymmetrical power amplifier circuit 32.

In an embodiment, the asymmetrical power amplifier circuit 32 includes a signal input 42 and a signal output 44. The signal input 42 receives the RF signal 38 in the time-variant input power $P_{IN}$ and the signal output 44 outputs the amplified RF signal 38 in the time-variant output power $P_{OUT}$. Understandably, the time-variant output power $P_{OUT}$ will be equal to a sum of the carrier output power $P_{OUT-C}$ and the peak output power $P_{OUT-P}$ when the carrier amplifier 34C and the peak amplifier 34P are both active. In contrast, the time-variant output power $P_{OUT}$ will be equal to the carrier output power $P_{OUT-C}$ when the peak amplifier 34P is inactive.

The asymmetrical power amplifier circuit 32 also includes an impedance inverter circuit 46 and an impedance control circuit 48. In an embodiment, the carrier amplifier 34C is coupled to the impedance control circuit 48 via the impedance inverter circuit 46, while the peak amplifier 34P is coupled directly to the impedance control circuit 48. Herein, the impedance control circuit 48 is configured to present a modulated carrier impedance $Z_M$ and a modulated peak impedance $Z_P$ to the carrier amplifier 34C and the peak amplifier 34P, respectively. According to an embodiment of the present disclosure, the modulated peak impedance $Z_P$ is higher than the modulated carrier impedance $Z_M$. As such, when the modulated peak voltage $V_{OUT-P}$ becomes equal to the modulated carrier voltage $V_{OUT-C}$ at the $P_{PEAK}$, the peak output power $P_{OUT-P}$ can be lower than the carrier output power $P_{OUT-C}$ according to the equations (Eq. 1 and 2).

Figure 3B:
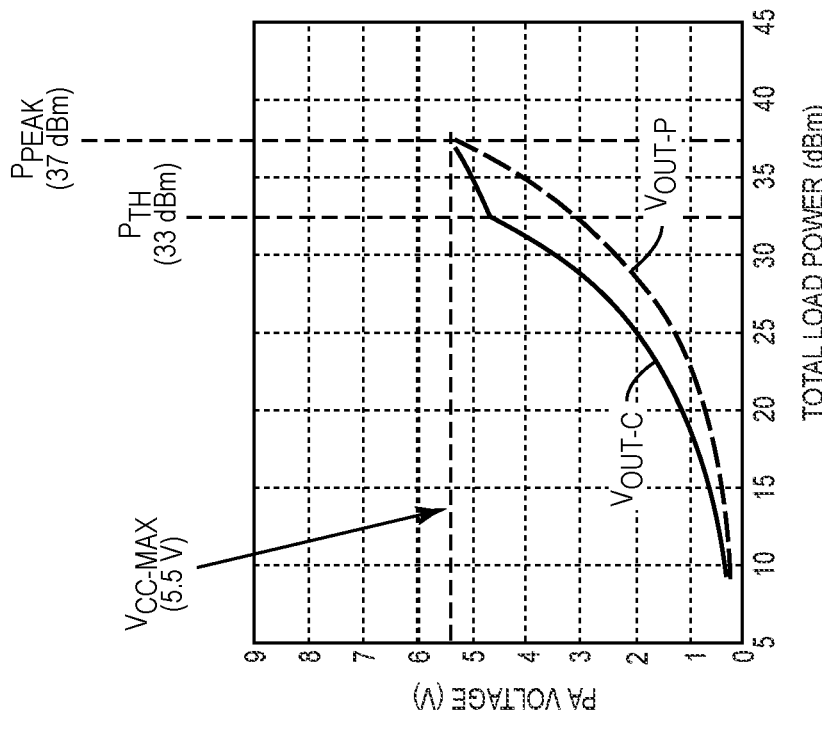
FIGS. 3A-3C are graphic diagrams providing exemplary illustrations of some distinctive characteristics of the asymmetrical power amplifier circuit of FIG. 2, as compared to the characteristics of the Doherty power amplifier circuit illustrated in FIGS. 1C-1E.
Figure 3A:
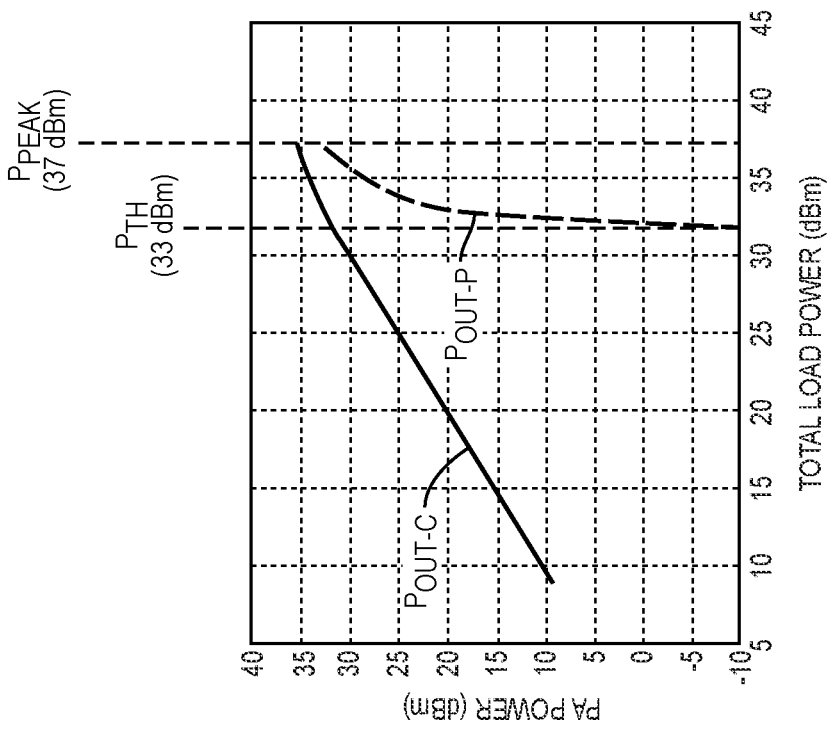
Figure 3C:
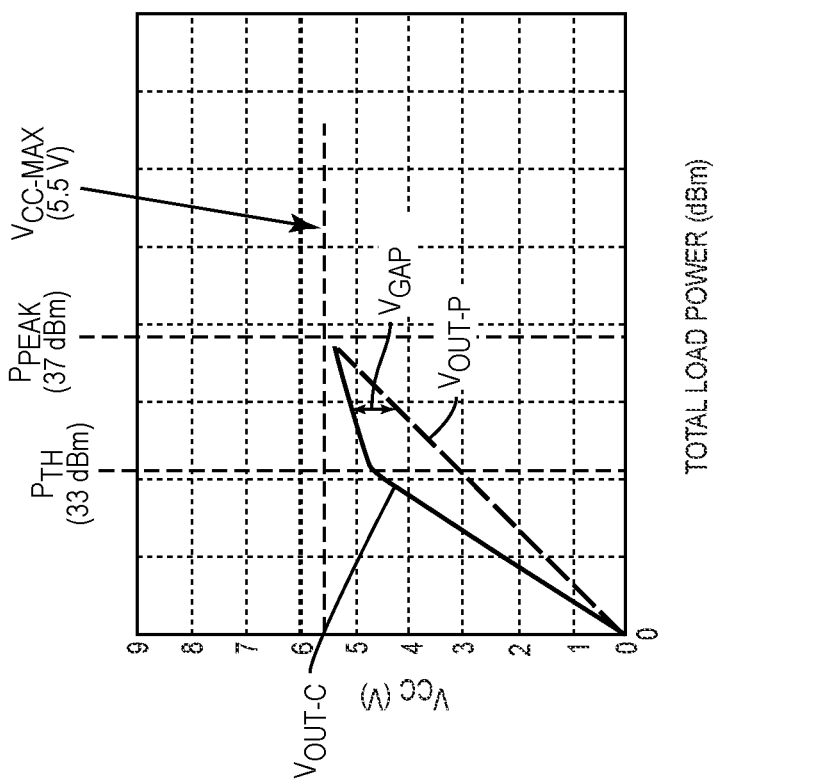

FIGS. 3A-3C are graphic diagrams providing exemplary illustrations of some distinctive characteristics of the asymmetrical power amplifier circuit 32 of FIG. 2, as compared to the characteristics of the Doherty power amplifier circuit 10 illustrated in FIGS. 1C-1E.

FIG. 3A shows a relationship between the carrier output power $P_{OUT-C}$ and the peak output power $P_{OUT-P}$ in the asymmetrical power amplifier circuit 32 of FIG. 2. Herein, the predefined power threshold $P_{TH}$ is set at 33 dBm, which is higher than the predefined power threshold $P_{TH}$ (37 dBm−6 dB=31 dBm) in the Doherty power amplifier circuit 10. When the time-variant output power $P_{OUT}$ is lower than the predefined power threshold $P_{TH}$, only the carrier amplifier 34C is active to amplify the carrier signal 38C to the carrier output power $P_{OUT-C}$. When the time-variant output power $P_{OUT}$ is higher than or equal to the predefined power threshold $P_{TH}$, the peak amplifier 34P becomes active to amplify the peak signal 38P to the peak output power $P_{OUT-P}$, while the carrier amplifier 34C continues to amplify the carrier signal 38C. Notably, the carrier output power $P_{OUT-C}$ is higher than the peak output power $P_{OUT-P}$ at the $P_{PEAK}$.

FIG. 3B shows a relationship between the modulated carrier voltage $V_{OUT-C}$ and the modulated peak voltage $V_{OUT-P}$ in the asymmetrical power amplifier circuit 32 of FIG. 2. When the time-variant output power $P_{OUT}$ is lower than the predefined power threshold $P_{TH}$, only the carrier amplifier 34C is active. In this regard, the modulated carrier voltage $V_{OUT-C}$ will increase as the time-variant output power $P_{OUT}$ increases. When the time-variant output power $P_{OUT}$ is higher than or equal to the predefined power threshold $P_{TH}$, the peak amplifier 34P becomes active. Accordingly, the modulated peak voltage $V_{OUT-P}$ will increase as the time-variant output power $P_{OUT}$ continues to climb. In the meantime, the carrier amplifier 16C will continue to increase the modulated carrier voltage $V_{OUT-C}$, as opposed to maintaining the modulated carrier voltage $V_{OUT-C}$ constantly at the $V_{CC-MAX}$ (e.g., 5.5 V). In a non-limiting example, the carrier amplifier 34C can be configured to change the modulated carrier voltage $V_{OUT-C}$ at a first rate (e.g., with a steeper curve) before the peak amplifier 34P becomes active, and at a second rate (e.g., with a flatter curve) slower than the first rate. As shown in FIG. 3B, the modulated carrier voltage $V_{OUT-C}$ and the modulated peak voltage $V_{OUT-P}$ will both increase to the $V_{CC-MAX}$ at the $P_{PEAK}$.

FIG. 3C shows the modulated voltage $V_{CC}$ received by the carrier amplifier 34C and the peak amplifier 34D at a respective collector electrode C. When the time-variant output power $P_{OUT}$ is lower than the predefined power threshold $P_{TH}$, only the carrier amplifier 34C is active. In this regard, the modulated voltage $V_{CC}$ can be an envelope tracking (ET) modulated voltage so modulated to closely track the modulated carrier voltage $V_{OUT-C}$. As a result, the carrier amplifier 34C can always operate in compression to achieve optimal efficiency.

Given that the modulated carrier voltage $V_{OUT-C}$ is lower than the $V_{CC-MAX}$ prior to the $P_{PEAK}$, the modulated voltage $V_{CC}$ modulated to track the modulated carrier voltage $V_{OUT-C}$ will also be lower than the $V_{CC-MAX}$ prior to the $P_{PEAK}$. As such, a gap $V_{GAP}$ between the modulated voltage $V_{CC}$ and the modulated peak voltage $V_{OUT-P}$ will become smaller. Therefore, the efficiency of the peak amplifier 34P may be improved.

Figure 4:
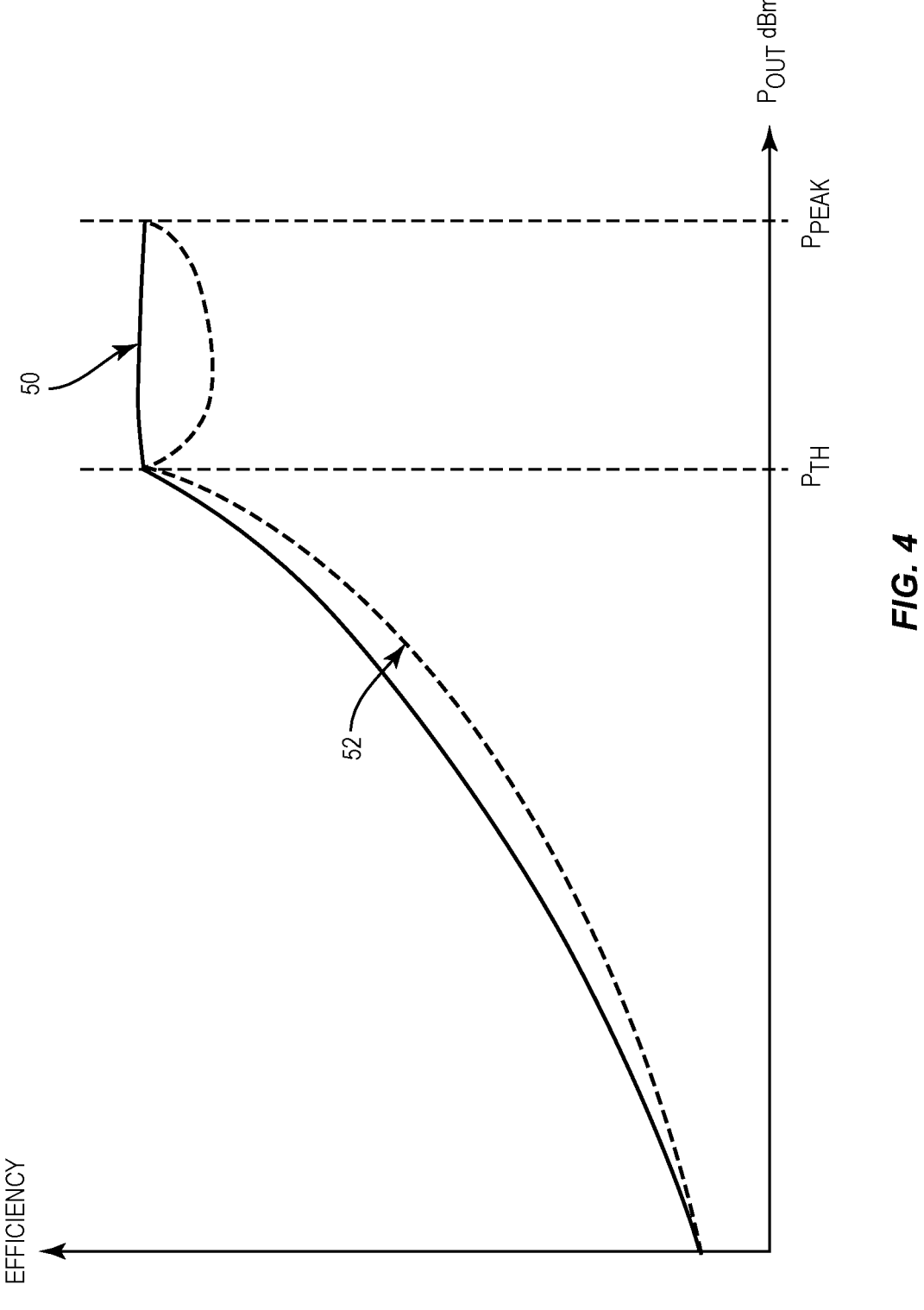
FIG. 4 is a graphic diagram illustrating an efficiency comparison between the asymmetrical power amplifier circuit of FIG. 2 and the Doherty power amplifier circuit of FIG. 1A.

FIG. 4 is a graphic diagram illustrating an efficiency comparison between the asymmetrical power amplifier circuit 32 of FIG. 2 and the Doherty power amplifier circuit 10 of FIG. 1A. Herein, a first efficiency curve 50 of the asymmetrical power amplifier circuit 32 of FIG. 2 is compared to a second efficiency curve 52 of the Doherty power amplifier circuit 10 of FIG. 1A.

Notably, the Doherty power amplifier circuit 10 only achieves optimal efficiency at the defined power threshold $P_{TH}$ and the $P_{PEAK}$. In contrast, the asymmetrical power amplifier circuit 32 can always achieve a higher efficiency over the Doherty power amplifier circuit 10.

Figure 5:
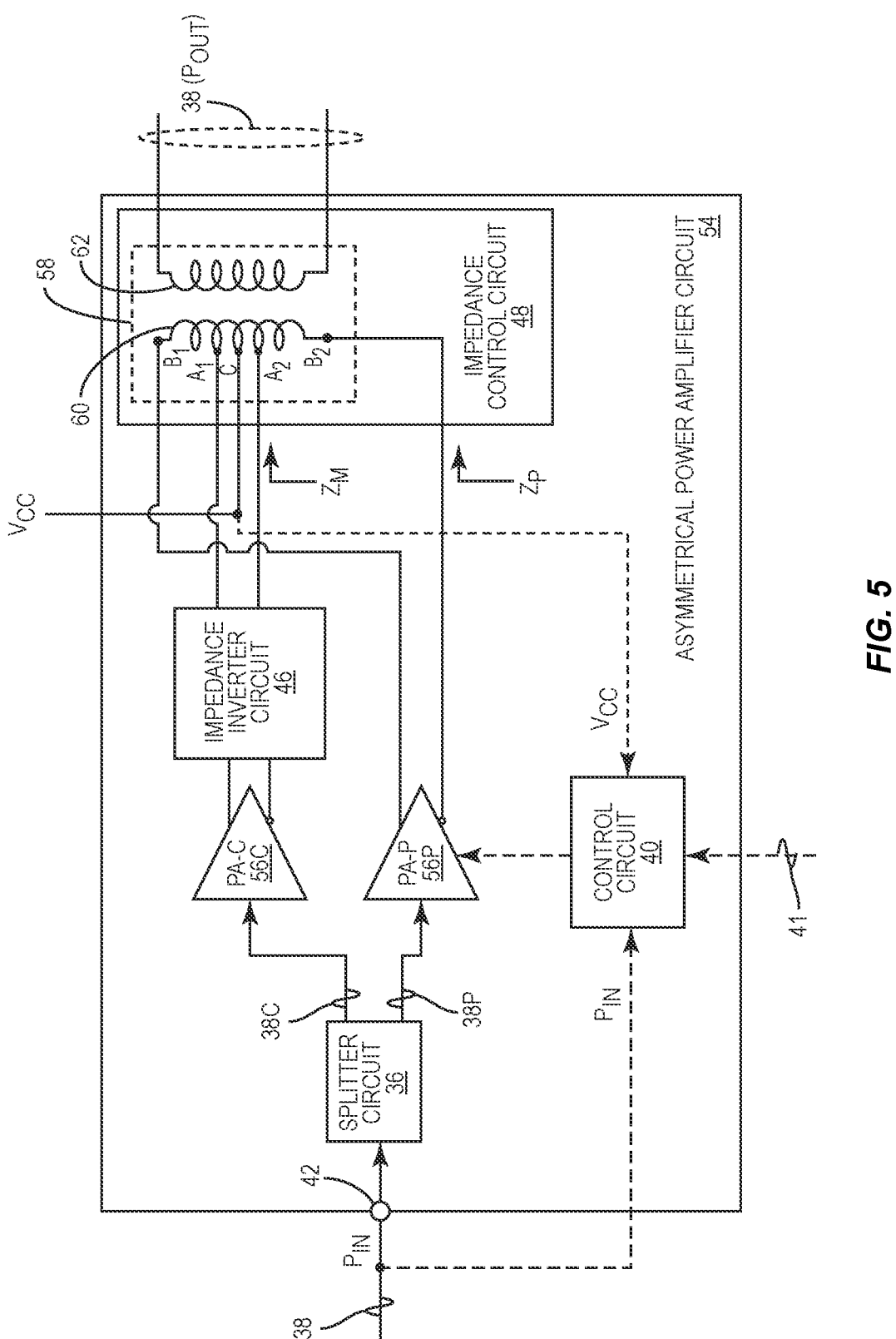
FIG. 5 is a schematic diagram of an exemplary asymmetrical power amplifier circuit configured according to an embodiment of the present disclosure.

In an embodiment, the carrier amplifier 34C and the peak amplifier 34P in the asymmetrical power amplifier circuit 32 can each be a differential amplifier. In this regard, FIG. 5 is a schematic diagram of an exemplary asymmetrical power amplifier circuit 54 configured according to an embodiment of the present disclosure. Common elements between FIGS. 2 and 5 are shown therein with common element numbers and will not be re-described herein.

The asymmetrical power amplifier circuit 54 includes a carrier amplifier 56C and a peak amplifier 56P, each configured to operate as a differential amplifier. In an embodiment, the impedance control circuit 48 includes a transformer 58 having an input coil 60 and an output coil 62.

Herein, the modulated voltage $V_{CC}$ is provided to a center node C of the input coil 60, the modulated carrier impedance $Z_M$ is provided by a pair of inner nodes $A_1$, $A_2$ of the input coil 60, and the modulated peak impedance $Z_P$ is provided by a pair of outer nodes $B_1$, $B_2$ of the input coil 60. Understandably, the modulated peak impedance $Z_P$ provided by the outer nodes $B_1$, $B_2$ will be higher than the modulated carrier impedance $Z_M$ provided by the inner nodes $A_1$, $A_2$.

Figure 6:
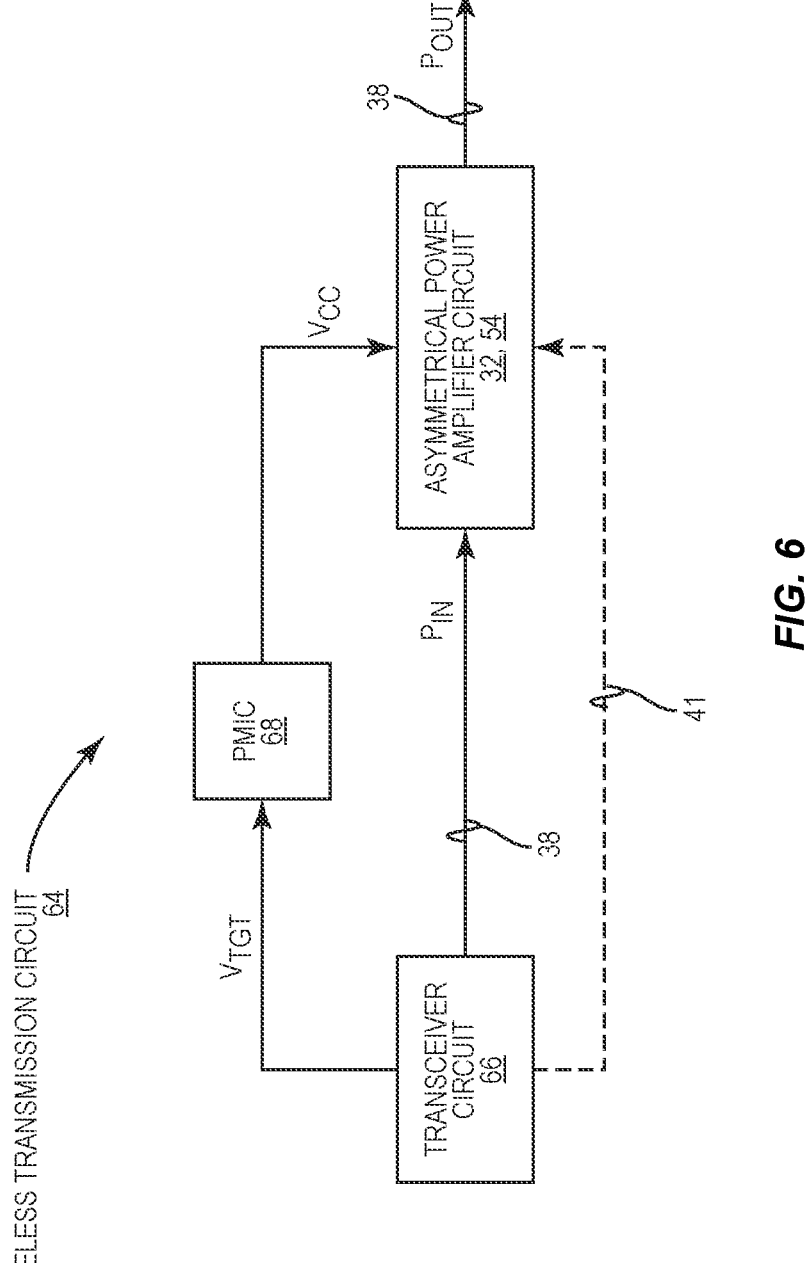
FIG. 6 is a schematic diagram of an exemplary wireless communication circuit that can be configured to incorporate the asymmetrical power amplifier circuits of FIGS. 2 and 5.

FIG. 6 is a schematic diagram of an exemplary wireless transmission circuit 64 that can incorporate the asymmetrical power amplifier circuit 32 of FIG. 2 and the asymmetrical power amplifier circuit 54 of FIG. 5. Common elements between FIGS. 2, 5, and 6 are shown therein with common element numbers and will not be re-described herein.

In an embodiment, the wireless transmission circuit 64 includes a transceiver circuit 66 and a power management integrated circuit (PMIC) 68. The transceiver circuit 66 is configured to generate the RF signal 38 in the time-variant input power $P_{IN}$ and provide the RF signal 38 to the asymmetrical power amplifier circuit 32 or the asymmetrical power amplifier circuit 54. The transceiver circuit 66 may also be configured to provide the externally generated indication signal 41 to the control circuit 40.

The PMIC 68 is configured to generate the modulated voltage $V_{CC}$ based on a modulated target voltage $V_{TGT}$. In an embodiment, the transceiver circuit 66 is configured to generate the modulated target voltage $V_{TGT}$ that closely tracks the time-variant input power $P_{IN}$ of the RF signal 38.

Figure 7:
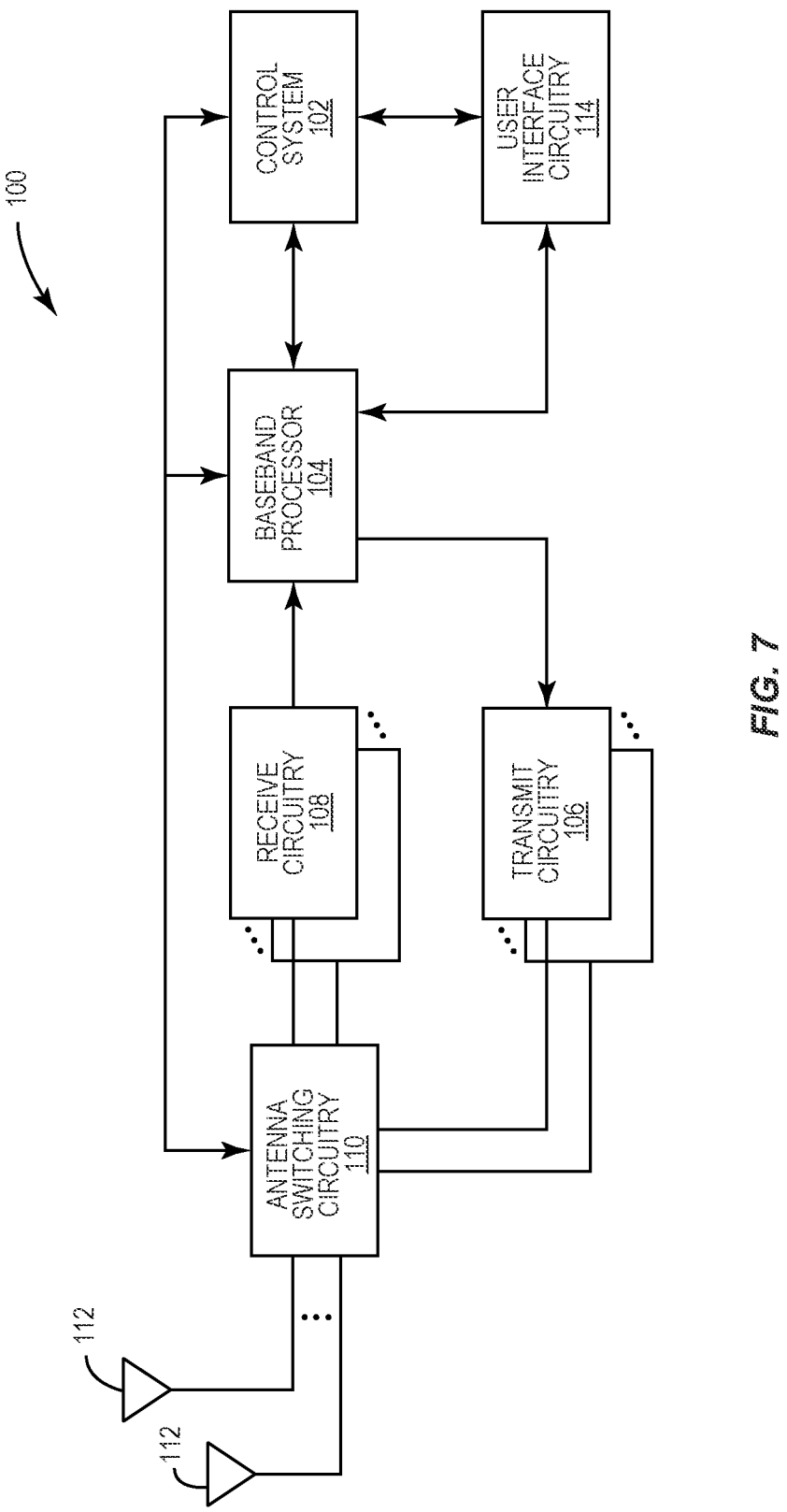
FIG. 7 is a schematic diagram of an exemplary user element wherein the wireless communication circuit of FIG. 6 can be provided.

The wireless transmission circuit 64 of FIG. 6 can be provided in a user element to enable bandwidth adaptation according to embodiments described above. In this regard, FIG. 7 is a schematic diagram of an exemplary user element 100 wherein the wireless communication circuit 64 of FIG. 6 can be provided.

Herein, the user element 100 can be any type of user element, such as mobile terminals, smart watches, tablets, computers, navigation devices, access points, and like wireless communication devices that support wireless communications, such as cellular, wireless local area network (WLAN), Bluetooth, and near field communications. The user element 100 will generally include a control system 102, a baseband processor 104, transmit circuitry 106, receive circuitry 108, antenna switching circuitry 110, multiple antennas 112, and user interface circuitry 114. In a non-limiting example, the control system 102 can be a field-programmable gate array (FPGA), as an example. In this regard, the control system 102 can include at least a microprocessor(s), an embedded memory circuit(s), and a communication bus interface(s). The receive circuitry 108 receives radio frequency signals via the antennas 112 and through the antenna switching circuitry 110 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC).

The baseband processor 104 processes the digitized received signal to extract the information or data bits conveyed in the received signal. This processing typically comprises demodulation, decoding, and error correction operations, as will be discussed in greater detail below. The baseband processor 104 is generally implemented in one or more digital signal processors (DSPs) and application specific integrated circuits (ASICs).

For transmission, the baseband processor 104 receives digitized data, which may represent voice, data, or control information, from the control system 102, which it encodes for transmission. The encoded data is output to the transmit circuitry 106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission, and deliver the modulated carrier signal to the antennas 112 through the antenna switching circuitry 110. The multiple antennas 112 and the replicated transmit and receive circuitries 106, 108 may provide spatial diversity. Modulation and processing details will be understood by those skilled in the art.

Those skilled in the art will recognize improvements and modifications to the preferred embodiments of the present disclosure. All such improvements and modifications are considered within the scope of the concepts disclosed herein and the claims that follow.

What is claimed is:

1. An asymmetrical power amplifier circuit comprising:
    a signal input configured to receive a radio frequency (RF) signal in a time-variant input power;
    a signal output configured to output the RF signal in a time-variant output power that equals a sum of a carrier output power and a peak output power;
    a carrier amplifier configured to amplify the RF signal from the time-variant input power to the carrier output power based on a modulated voltage;
    a peak amplifier configured to amplify the RF signal from the time-variant input power to the peak output power based on the modulated voltage; and
    an impedance control circuit coupled to the carrier amplifier and the peak amplifier and configured to cause the carrier output power to be different from the peak output power at a peak of the time-variant output power of the RF signal.

2. The asymmetrical power amplifier circuit of claim 1, wherein the impedance control circuit is further configured to cause the carrier output power to be higher than the peak output power at the peak of the time-variant output power of the RF signal.

3. The asymmetrical power amplifier circuit of claim 2, wherein the impedance control circuit is further configured to modulate a carrier impedance seen by the carrier amplifier to be different from a peak impedance seen by the peak amplifier to thereby cause the carrier output power to be different from the peak output power.

4. The asymmetrical power amplifier circuit of claim 3, wherein the impedance control circuit is further configured to modulate the carrier impedance to be lower than the peak impedance to thereby cause the carrier output power to be higher than the peak output power.

5. The asymmetrical power amplifier circuit of claim 3, wherein the impedance control circuit comprises a transformer comprising an input coil and an output coil, the input coil comprising:
    a center node configured to receive the modulated voltage;
    a pair of inner nodes configured to modulate the carrier impedance seen by the carrier amplifier; and
    a pair of outer nodes configured to modulate the peak impedance seen by the peak amplifier.

6. The asymmetrical power amplifier circuit of claim 1, further comprising a control circuit configured to:
    activate the peak amplifier in response to the time-variant output power of the RF signal being higher than or equal to a predefined power threshold; and
    deactivate the peak amplifier in response to the time-variant output power of the RF signal being lower than the predefined power threshold.

7. The asymmetrical power amplifier circuit of claim 6, wherein the control circuit is further configured to determine the time-variant output power of the RF signal based on at least one of: the modulated voltage, the time-variant input power of the RF signal, and an externally generated indication signal.

8. The asymmetrical power amplifier circuit of claim 6, wherein the predefined power threshold is higher than the peak of the time-variant output power minus six decibels (6 dB).

9. The asymmetrical power amplifier circuit of claim 6, wherein:
    the carrier output power is a function of a modulated carrier voltage at a respective collector of the carrier amplifier;
    the peak output power is a function of a modulated peak voltage at a respective collector of the peak amplifier; and
    the modulated carrier voltage and the modulated peak voltage are each proportionally related to the modulated voltage.

10. The asymmetrical power amplifier circuit of claim 9, wherein the carrier amplifier is further configured to:
    increase the modulated carrier voltage at a first rate before the peak amplifier is activated; and
    increase the modulated carrier voltage at a second rate slower than the first rate after the peak amplifier is activated.

11. The asymmetrical power amplifier circuit of claim 10, wherein the modulated carrier voltage is equal to the modulated peak voltage at the peak of the time-variant output power of the RF signal.

12. A wireless communication circuit comprising:

a transceiver circuit configured to generate a radio frequency (RF) signal in a time-variant input power; and an asymmetrical power amplifier circuit comprising:

a signal input configured to receive the RF signal in the time-variant input power;

a signal output configured to output the RF signal in a time-variant output power that equals a sum of a carrier output power and a peak output power;

a carrier amplifier configured to amplify the RF signal from the time-variant input power to the carrier output power based on a modulated voltage;

a peak amplifier configured to amplify the RF signal from the time-variant input power to the peak output power based on the modulated voltage; and an impedance control circuit coupled to the carrier amplifier and the peak amplifier and configured to cause the carrier output power to be different from the peak output power at a peak of the time-variant output power of the RF signal.

13. The wireless communication circuit of claim 12, further comprising a power management integrated circuit (PMIC) configured to generate the modulated voltage.

14. The wireless communication circuit of claim 12, wherein the impedance control circuit is further configured to cause the carrier output power to be higher than the peak output power at the peak of the time-variant output power of the RF signal.

15. The wireless communication circuit of claim 14, wherein the impedance control circuit is further configured to modulate a carrier impedance seen by the carrier amplifier to be different from a peak impedance seen by the peak amplifier to thereby cause the carrier output power to be different from the peak output power.

16. The wireless communication circuit of claim 15, wherein the impedance control circuit is further configured to modulate the carrier impedance to be lower than the peak impedance to thereby cause the carrier output power to be higher than the peak output power.

17. The wireless communication circuit of claim 15, wherein the impedance control circuit comprises a transformer comprising an input coil and an output coil, the input coil comprising:

a center node configured to receive the modulated voltage;

a pair of inner nodes configured to modulate the carrier impedance seen by the carrier amplifier; and a pair of outer nodes configured to modulate the peak impedance seen by the peak amplifier.

18. The wireless communication circuit of claim 12, wherein the asymmetrical power amplifier circuit further comprises a control circuit configured to:

activate the peak amplifier in response to the time-variant output power of the RF signal being higher than or equal to a predefined power threshold; and deactivate the peak amplifier in response to the time-variant output power of the RF signal being lower than the predefined power threshold.

19. The wireless communication circuit of claim 18, wherein the control circuit is further configured to determine the time-variant output power of the RF signal based on at least one of: the modulated voltage, the time-variant input power of the RF signal, and an externally generated indication signal provided by the transceiver circuit.

20. The wireless communication circuit of claim 18, wherein:

the carrier output power is a function of a modulated carrier voltage at a respective collector of the carrier amplifier;

the peak output power is a function of a modulated peak voltage at a respective collector of the peak amplifier; and the modulated carrier voltage and the modulated peak voltage are each proportionally related to the modulated voltage.

\* \* \* \* \*